US008235768B2

(12) United States Patent
Lin et al.

(10) Patent No.: US 8,235,768 B2
(45) Date of Patent: Aug. 7, 2012

(54) COOLER WITH GROUND HEATED PLANE AND GRINDING METHOD AND APPARATUS THEREOF

(75) Inventors: Kuo-Len Lin, Wugu Township, Taipei County (TW); Chen-Hsiang Lin, Wugu Township, Taipei County (TW); Jui-Ho Liu, Wugu Township, Taipei County (TW); Chih-Hung Cheng, Wugu Township, Taipei County (TW); Ken Hsu, Wugu Township, Taipei County (TW)

(73) Assignees: Golden Sun News Techniques Co., Ltd., Taipei County (TW); Cpumate Inc, Taipei County (TW)

( * ) Notice: Subject to any disclaimer, the term of this patent is extended or adjusted under 35 U.S.C. 154(b) by 594 days.

(21) Appl. No.: 12/482,000

(22) Filed: Jun. 10, 2009

(65) Prior Publication Data
US 2010/0314078 A1 Dec. 16, 2010

(51) Int. Cl.
*B24B 1/00* (2006.01)
(52) U.S. Cl. ............... 451/36; 451/57; 451/60; 451/294; 451/278; 451/280
(58) Field of Classification Search ............ 451/36, 451/57, 60, 294, 278, 280
See application file for complete search history.

(56) References Cited

U.S. PATENT DOCUMENTS

| 2,883,802 | A | * | 4/1959 | Katzke | 451/56 |
| 4,481,741 | A | * | 11/1984 | Bouladon et al. | 451/285 |
| 5,468,177 | A | * | 11/1995 | Kindler et al. | 451/364 |
| 5,591,073 | A | * | 1/1997 | Turgeon | 451/314 |
| 6,010,392 | A | * | 1/2000 | Evans et al. | 451/41 |
| 6,074,283 | A | | 6/2000 | Maeda et al. | |
| 6,435,496 | B1 | | 8/2002 | Phillips | |
| 6,663,477 | B1 | * | 12/2003 | Gee | 451/364 |
| 6,733,368 | B1 | * | 5/2004 | Pan et al. | 451/36 |
| 7,115,020 | B1 | * | 10/2006 | Biskeborn | 451/11 |
| 2002/0039874 | A1 | * | 4/2002 | Hecker et al. | 451/7 |
| 2002/0187731 | A1 | * | 12/2002 | Chen et al. | 451/36 |
| 2004/0209546 | A1 | * | 10/2004 | Nishioka et al. | 451/5 |

FOREIGN PATENT DOCUMENTS

| EP | 0480678 A2 | 4/1992 |
| JP | P2003-188320 A | 7/2003 |

OTHER PUBLICATIONS

European Serch Report; European Patent Office 80298 Munich Germany.; Ter Meer-Steinmester & Partner Gbr.; Application #09007778.5-2302; Applicant: Cpumate Inc., et al. Date: Mar. 12, 2010.

* cited by examiner

*Primary Examiner* — George Nguyen
(74) *Attorney, Agent, or Firm* — Chun Ming Shih; HDLS IPR Services

(57) ABSTRACT

A method for making heated plane of a cooler obtain better flatness and roughness includes a grinder with a grinding plate and a fixture. Then, the cooler is arranged onto the fixture. Next, the abrasive is injected into the gap between the grinding plate and the heated plane, making the fixture press and clamp the cooler in a way, such that the heated plane of the cooler contacts the abrasive closely. Finally, the grinding plate is rotated to make at least one grinding process to the heated plane, making the heated plane obtain a surface with better roughness and flatness, further enhancing the contact tightness between the heated plane and a heating element, and therefore promoting the thermally conductive efficiency between the cooler and the heating element.

4 Claims, 11 Drawing Sheets

COOLER WITH GROUND HEATED PLANE AND GRINDING METHOD AND APPARATUS THEREOF

BACKGROUND OF THE INVENTION

1. Field of the Invention

The present invention in general relates to a cooler, in particular, to a cooler, a heated plane of which is ground, and to a grinding method thereof.

2. Description of Prior Art

Following progress of technology, computer hardware is developed toward the directions of high speed and high frequency for increasing its execution efficiency, but its power consumption is also increased relatively. Compared to the prior arts, the heat generated from today's electronic component is much more significant than the past's. If the accumulative heat is not removed in time, the electronic component will be overheated to lower down the operation efficiency, even cause damage. So, most electronic component needs cooling device to control the working temperature and keep it operated under normal condition.

When operated, a cooling device, including vapor chamber or heat pipe, is first combined to a thermally conductive seat and is arranged a plurality of cooling fins thereon. Next, one side of the thermally conductive seat is contacted closely with the heating electronic component. Thereby, the heat generated from the heating electronic component is thermally conducted. However, since of the limitation of many factors, such as cooling space and power consumption, how to promote cooling efficiency as high as we can becomes an issue intended to be addressed urgently by industry.

Nonetheless, the more flat a heated face of a cooler is, the more compact a thermal contact between the heated face and the heating electronic component will be. In other words, a good flatness of the heated face will promote the thermally conductive efficiency of the cooler. In addition, the heated face of a general cooler is usually configured as a matte, which looks flat and smooth after machined. However, in practice, the roughness and flatness on the surface of the heated face is still poor, making the heated face and the heating component unable to be contacted closely, thereby, limiting the thermal conduction between the heated face and the heating electronic component. Therefore, if the roughness and the flatness on the heated face can be further improved, the contact tightness between the heated face and the heating electronic component will be thereby increased, so is the thermally conductive effect.

Accordingly, after a substantially devoted study, in cooperation with the application of relative academic principles, the inventor has finally proposed the present invention that is designed reasonably to possess the capability to improve the drawbacks of the prior art significantly.

SUMMARY OF THE INVENTION

The invention is mainly to provide a cooler with ground heated plane and a grinding method and apparatus thereof. By grinding the heated plane of the cooler, the roughness and flatness on the surface of the heated plane is improved. Furthermore, the thermally conductive effect is enhanced due to a better contact relative to the heating electronic component.

Secondly, the invention is to provide a method for grinding the heated plane of a cooler, the method including the following steps: (a) providing a grinder and a fixture, which have a grinding plate; (b) providing a cooler, which has a heated plane, and arranging the cooler to the fixture; (c) injecting an abrasive into the gap between the grinding plate and the heated plane; (d) making the fixture press and clamp the cooler, thereby, the heated plane being contacted closely with the abrasive; and (e) rotating the grinding plate, and undergoing at least one grinding process to the heated plane.

Thirdly, the invention is to provide an apparatus for grinding the heated plane of a cooler, in which a heated plane of a cooler is ground. The apparatus includes a grinder and a fixture, in which the grinder has a grinding plate and an abrasive supply barrel that is arranged above the grinding plate for supplying abrasive into the gap between the heated plane and the grinding plate. In the meantime, the fixture is combined to the grinder and has at least one pressure plate for arranging the cooler. Thereby, the pressure plate presses and clamps the cooler, making the heated plane of the cooler contact closely to the abrasive.

Fourthly, the invention is to provide a cooler having ground heated plane for cooling a heating electronic component, mainly including a cooler, which has a heated plane that is undergone a grinding process by being pressed and clamped by a fixture. After being ground, the roughness on the surface of the heated plane is under Ra 0.03 µm and the flatness is under 10 µm.

Compared with the prior arts, the invention is to arrange a fixture to a grinder. The fixture presses and clamps a cooler via a point contact manner, whereby the heated plane of the cooler can possess a better flatness and surface roughness after being ground. Therefore, the contact tightness between the heated plane and the heating electronic component is increased, further generating a better effect of thermal conduction and enhancing the practicability of the invention.

BRIEF DESCRIPTION OF DRAWING

The features of the invention believed to be novel are set forth with particularity in the appended claims. The invention itself, however, may be best understood by reference to the following detailed description of the invention, which describes a number of embodiments of the invention, taken in conjunction with the accompanying drawings, in which:

DETAILED DESCRIPTION OF THE INVENTION

In cooperation with attached drawings, the technical contents and detailed description of the present invention are described thereinafter according to a number of preferable embodiments, not used to limit its executing scope. Any equivalent variation and modification made according to appended claims is all covered by the claims claimed by the present invention.

Figure 1:
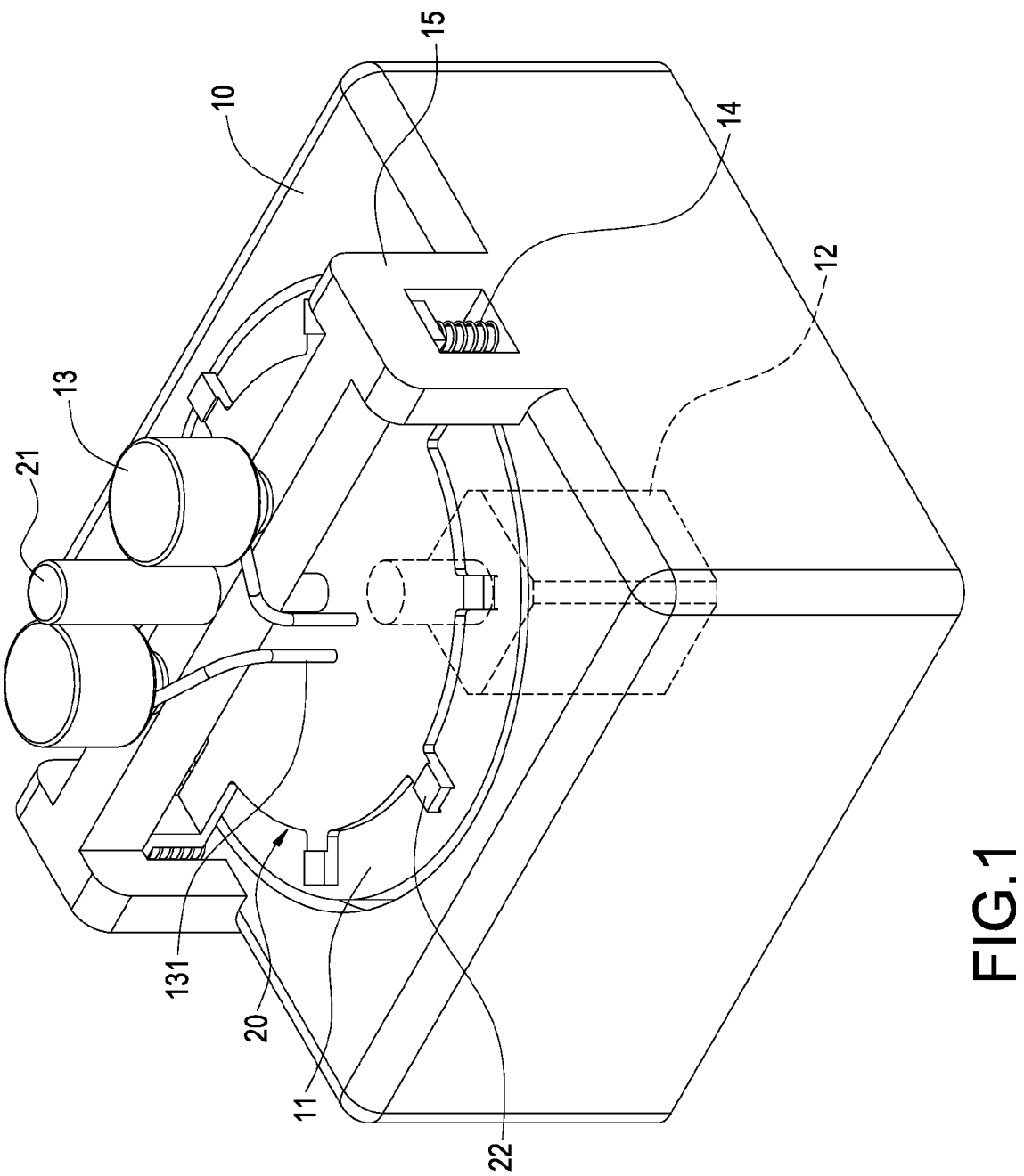
FIG. 1 is an assembled illustration of a grinder and a fixture according to the present invention.

Please refer to FIG. 1, which is an assembled illustration of a grinder and a fixture according to the present invention. The invention is to provide a method for grinding the heated plane of a cooler, in which a grinder 10 having grinding plate 11 and fixing frame 15 is provided. The grinding plate 11 is actuated by a motor 12 to rotate. The fixing frame 15 is fixed onto the grinder 10 and is arranged an abrasive supply barrel 13 thereon. The abrasive supply barrel 13 is filled with abrasive and has a nozzle 131 to inject the abrasive onto the grinding plate 11.

Above the grinding plate 11, the grinder 10 is additionally connected a fixture 20. At least one elastic element 14 (e.g., spring, etc.) is arranged between the fixture 20 and the grinder 10. The elastic element 14 keeps a gap 100 between the fixture 20 and the grinder 11, such that the fixture 20 can be displaced upwardly and downwardly in an elastic way. In addition, a driving device 21, such as hydraulic cylinder or pneumatic cylinder, is arranged on the fixing frame 15. The driving device 21 is connected by abutting against the fixture. By elevating or lowering the driving device 21, the fixture 20 is moved toward or far away the grinding plate 11.

Figure 2:
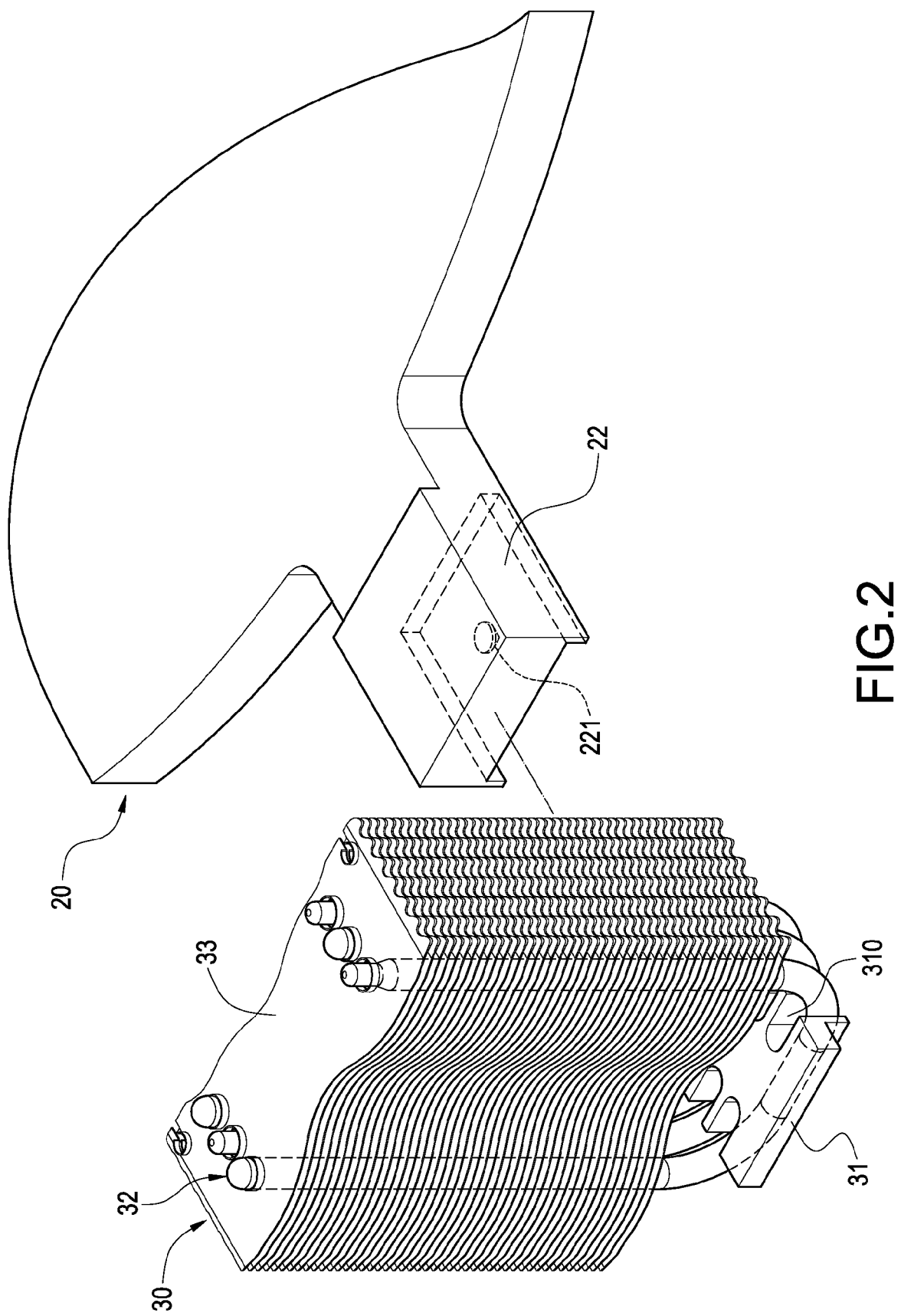
FIG. 2 is an illustration of a cooler pressed and clamped by a fixture according to the present invention.
Figure 3:
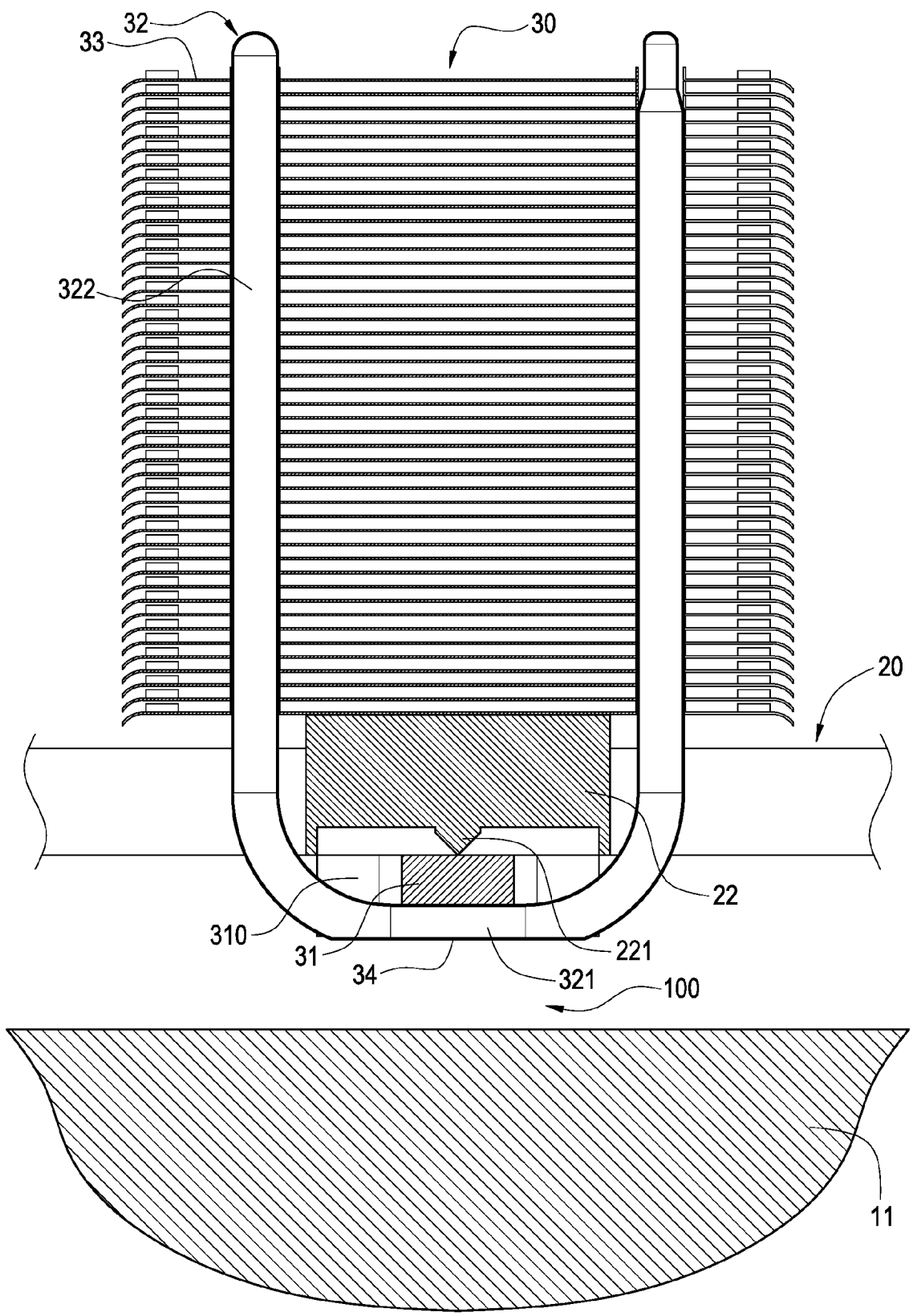
FIG. 3 is a cross-sectional view of a cooler pressed and clamped by a fixture according to the present invention.
Figure 4:
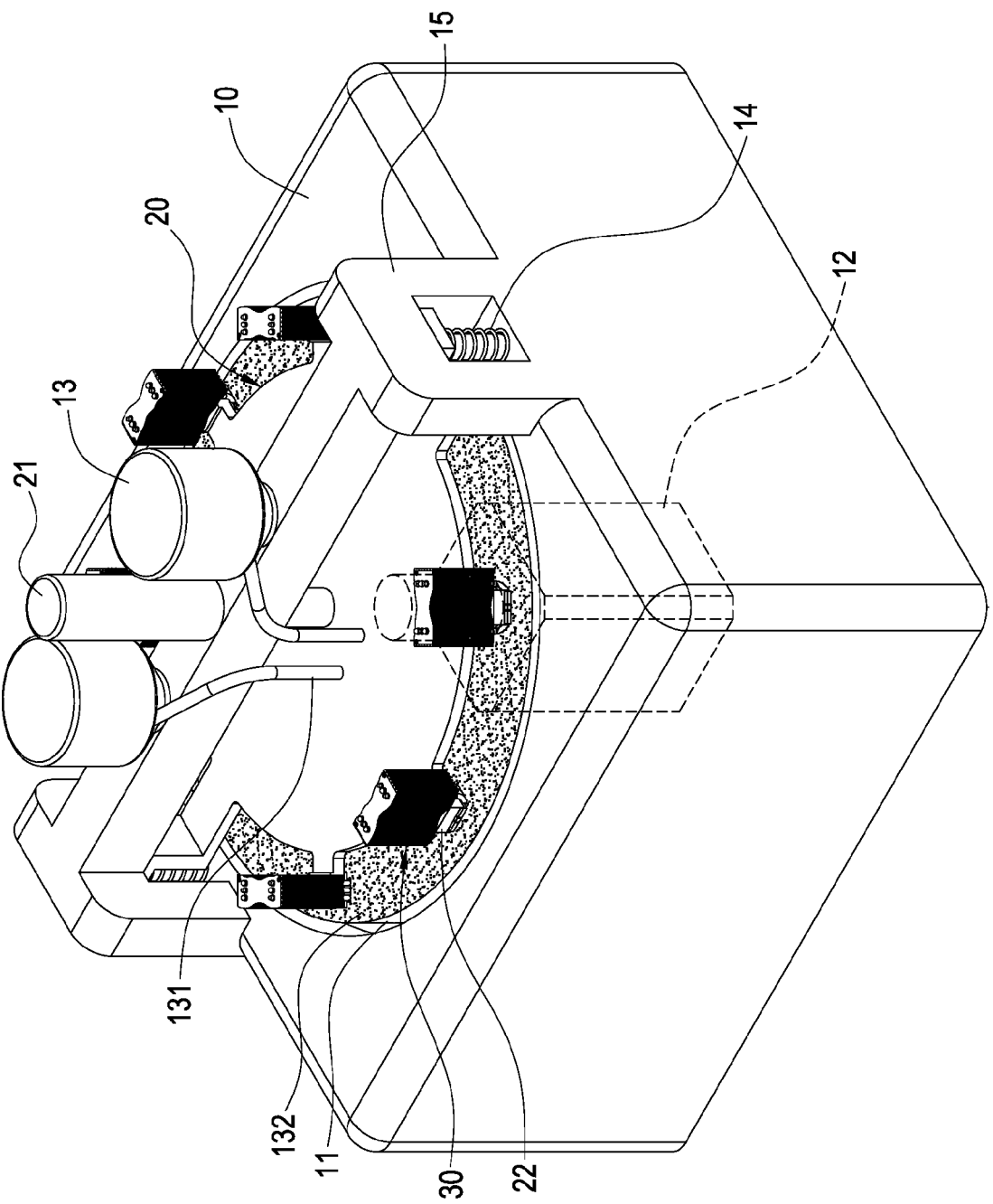
FIG. 4 is a using illustration showing a cooler under a grinding process according to the present invention.
Figure 5:
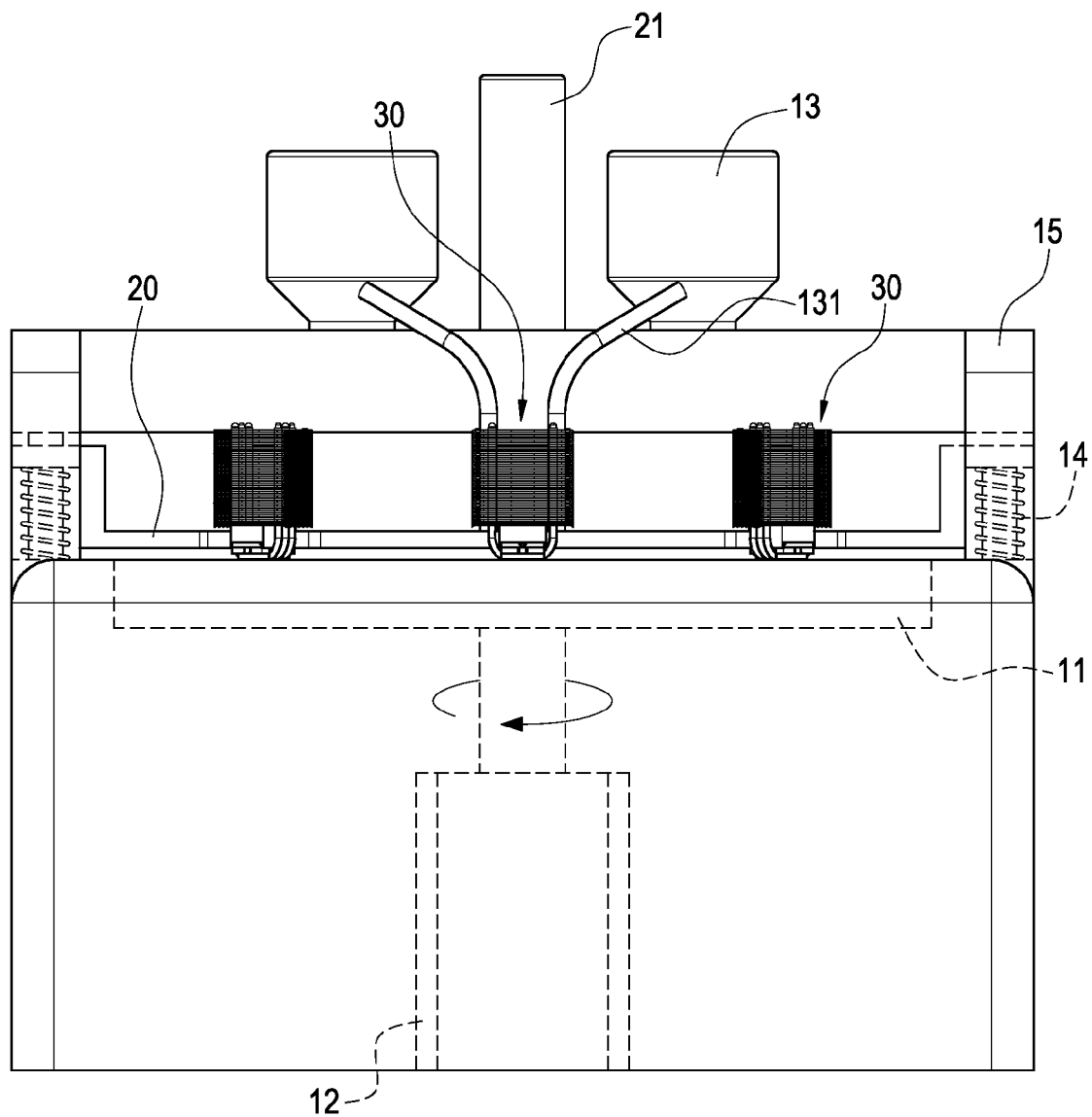
FIG. 5 is a lateral view of the invention when undergoing a grinding process.
Figure 6:
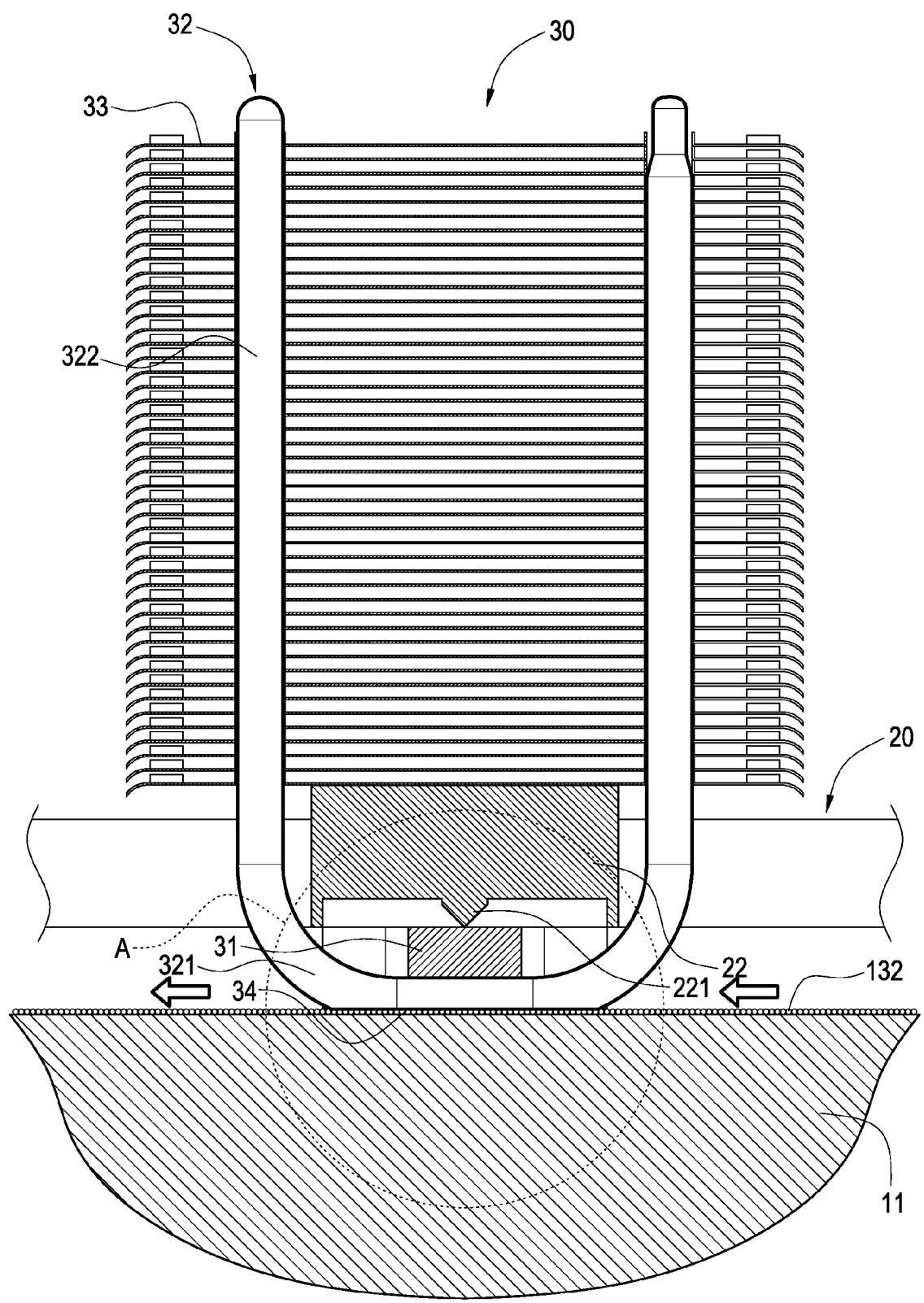
FIG. 6 is an illustration showing a grinding action of the invention.

Please refer to FIG. 2 and FIG. 3, which are an illustration and a cross-sectional view of a cooler that is pressed and clamped by a fixture according to the present invention. The fixture 20 can corresponds to the grinding plate 11 and is shown as a disk configuration. The circumference of the fixture 20 is divided equally to project out a plurality of pressure plates 22, each of which is arranged a cooler 30. In addition, the bottom portion of the pressure plate 22 is arranged a pointed bulge 221 that is abutted against the center of the cooler 30, thereby, the fixture 20 pressing and clamping the cooler 30 via a point contact manner.

In a preferable embodiment, the cooler 30 includes a thermally conductive seat 31, at least one heat pipe 32 and a plurality of cooling fins 33. The heat pipe 32 has a flat evaporation section 321 and a condensation section 322. The thermally conductive seat 31 is arranged at least one slot 310, into which the flat evaporation section 321 is inset. In the meantime, the plural cooling fins 33 are arranged by being passed through by the condensation section 322 of the heat pipe 32. In this case, the flat evaporation section 321 is formed as a heated plane 34 provided for contacting the heat source. When the top portion of the thermally conductive seat 31 is pressed and clamped by the pointed bulge 221 of the pressure plate 22, the heated plane 34 of the cooler 30 is abutted against the grinding plate 11 and is arranged correspondingly.

Figure 7:
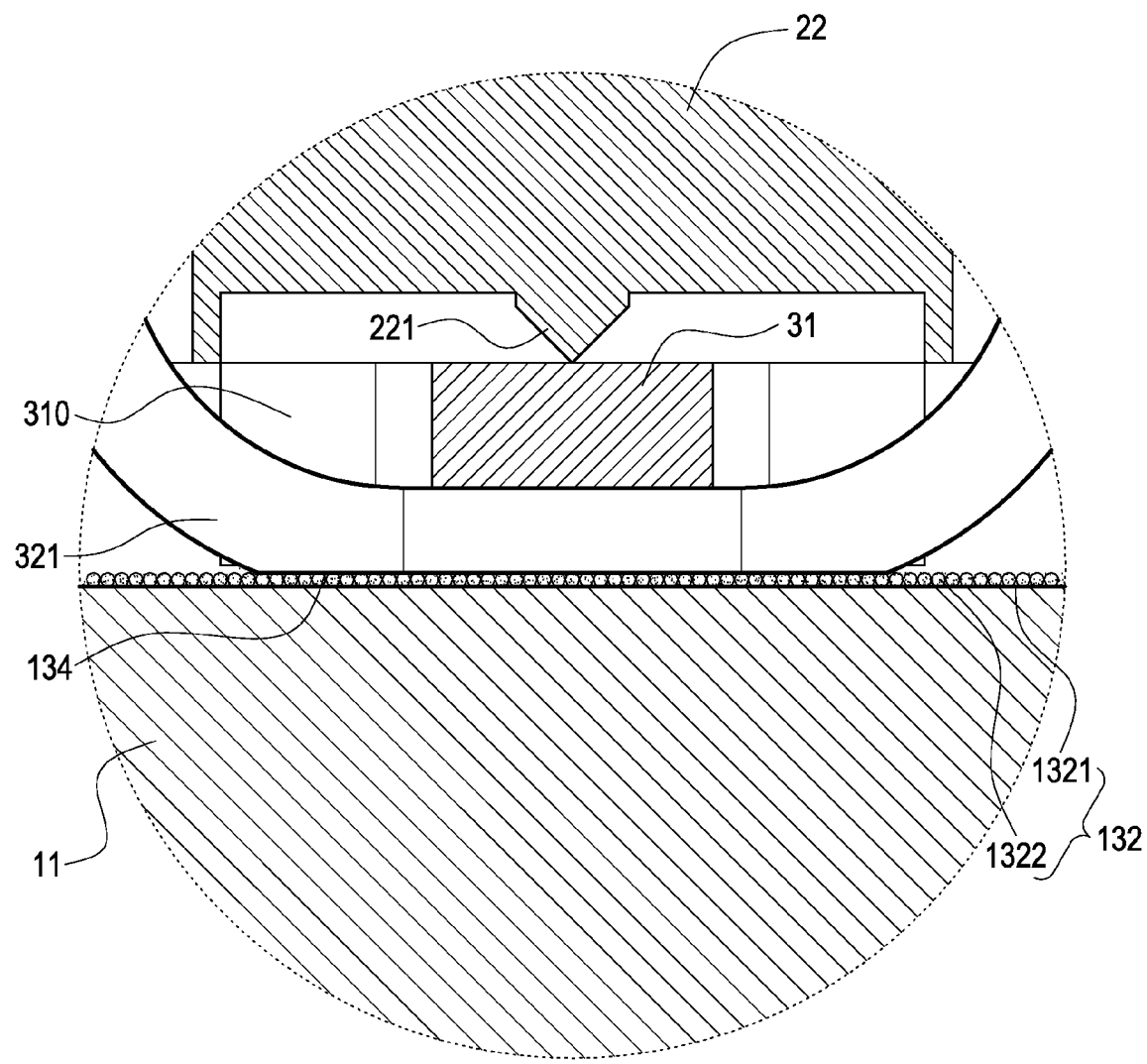
FIG. 7 is a locally enlarging illustration of the invention when undergoing a grinding process.

Please refer to FIG. 4 through FIG. 7, separately showing a using illustration of a cooler under a grinding process according to the present invention, a lateral view of the invention when undergoing a grinding process, an illustration of a grinding action of the invention, and a locally enlarging illustration of the invention when undergoing a grinding process. Firstly, a cooler 30 is separately arranged under each pressure plate 22 of the fixture 20. Secondly, an abrasive 132 is injected into the gap 100 between the grinder 11 and the heated plane 34. The abrasive 132 includes grinding liquid 1321 and grinding particle 1322, as shown in FIG. 7. Then, the driving device 21 is actuated, making the fixture 20 lowered down and the pressure plate 22 separately press and clamp the top portion of each thermally conductive seat 31. In so doing, the pointed bulge 221 presses and clamps at the center of the thermally conductive seat 31, making each heated plane 34 touch the abrasive 132 and closely contact the grinding plate 11. Next, the motor 12 is actuated to bring along the grinding plate 11 to make a circular rotation. By centrifugal force and pressing (clamping) operation, the abrasive 132 can uniformly grind the heated plane 34. Thereby, the flatness of the heated plane 34 is improved to obtain a best value of roughness on the surface. After the grinding is finished, the driving device 21 is actuated again and lifted up. In so doing, the fixture 20 is rid of press and clamp and lifted up due to the elastically recovering force of the elastic element 14. Finally, the heated plane 34 of the cooler 30 gets rid of the relative contact with the grinding plate 11.

Subsequently, the coolers 30 can be moved to another grinding machine to undergo next grinding. Or, a series of grinding can be made in a grinder by separately injecting different abrasives 132 with different particle sizes. For example, a grinding process can first be undergone by injecting an abrasive 132 with larger particles. After the first grinding process, another abrasive 132 with finer particle is then injected to undergo a second grinding process. Following each grinding process, a finer abrasive 132 is injected until the required accuracy of the heated plane 34 is reached. In an embodiment, the value of the surface roughness is under Ra 0.03 μm, preferably, between Ra 0.03 μm and Ra 0.01 μm and the flatness is between 0.3 μm and 10 μm.

Figure 8:
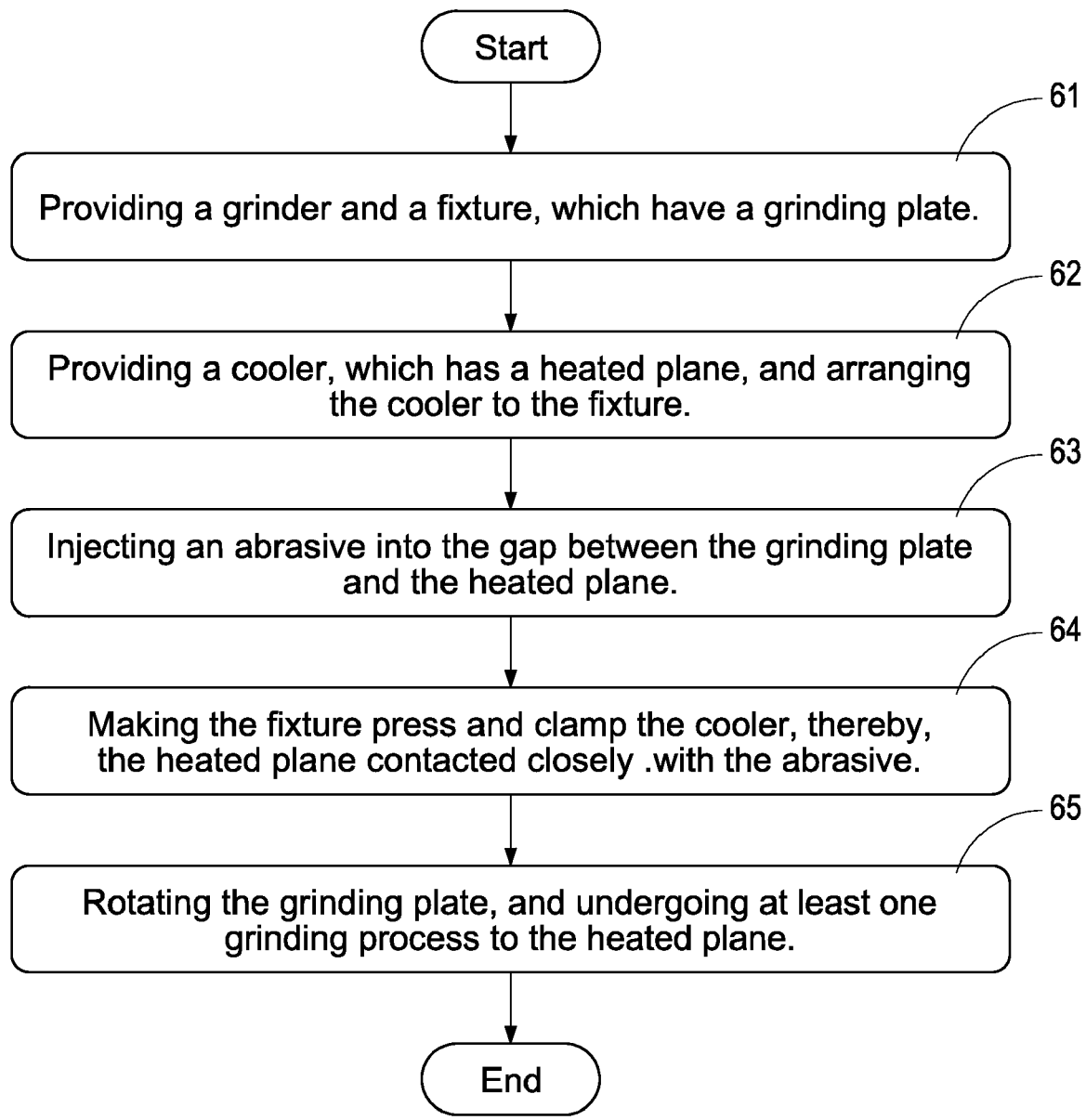
FIG. 8 is a flowchart diagram showing a grinding method of the invention, in which a heated plane of a cooler is ground.

Please refer to FIG. 8, which is a flowchart diagram showing a grinding method of the invention, in which a heated plane of a cooler is ground. As shown in this diagram, a grinder 10 and a fixture 20, with a grinding plate 11, is first provided (step 61); next, a cooler 30 with a heated plane 34 is further provided (step 62); then, an abrasive 132 is injected into the gap between the grinding plate 11 and the heated plane 34 (step 63); during a series of grindings, different abrasives 132 with different particle sizes can be injected and, in the meantime, the fixture 20 presses and clamps the cooler 30 via a point contact manner, for example, another side of the heated plane 34 being pressed and clamped, making the heated plane 34 contact closely to the grinding plate 11 to touch the abrasive 132 (step 64); finally, the grinding plate 11 is rotated, making the heated plane 34 undergone at least one grinding process (step 65).

Figure 9:
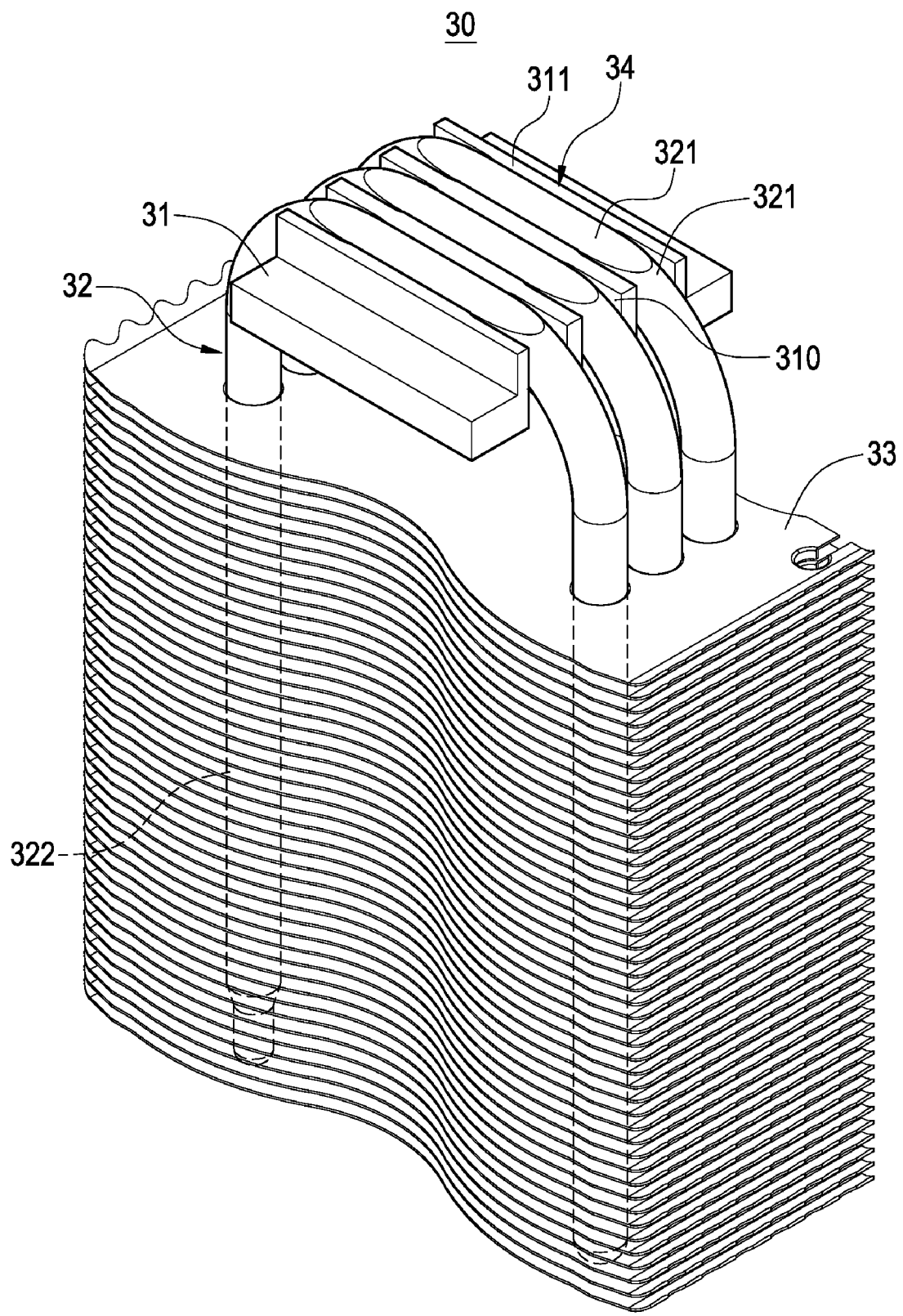
FIG. 9 shows a cooler with ground heated plane according to an embodiment of the invention.

Please refer to FIG. 9 showing a cooler with ground heated plane according to an embodiment of the invention. In this embodiment, the thermally conductive seat 31 has a bottom plane 311 that is arranged at least one slot 310, into which the flat evaporation section 321 of the heat pipe 32 is inset. When the surface of the flat evaporation sections 321 is higher than the bottom plane 311 of the thermally conductive seat 31, the flat evaporation sections 321 are the heated plane 34. Nonetheless, when the surface of the flat evaporation sections 321 is flush with the bottom plane 311 of the thermally conductive seat 31, the heated plane 34 then includes the flat evaporation sections 321 and the bottom plane 311. After the heated plane 34 is ground, a delicate plane like mirror is obtained, which is provided for closely contacting a heating electronic component to dissipate the heat thereof.

Figure 10:
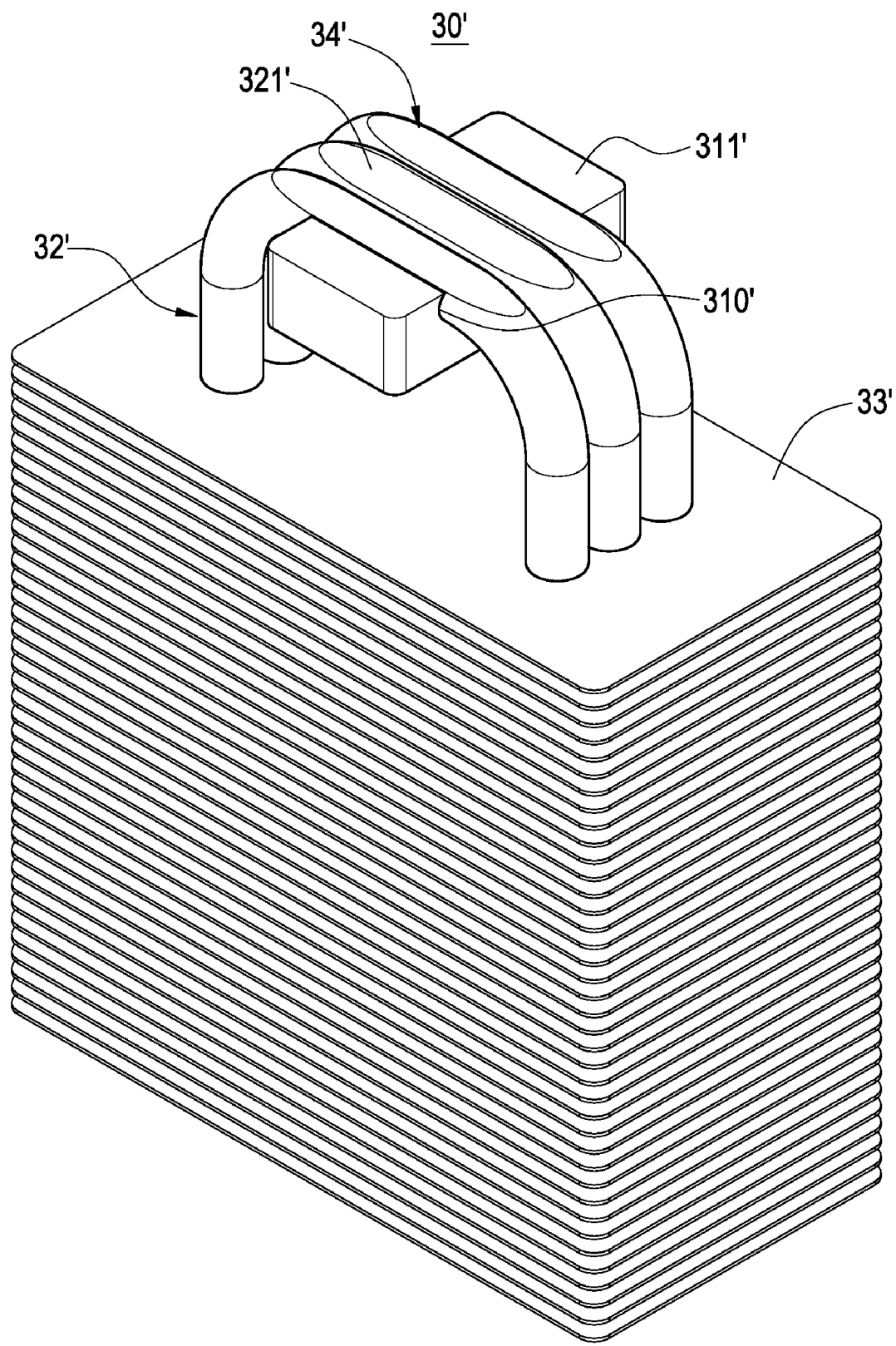
FIG. 10 shows a cooler with ground heated plane according to another embodiment of the invention.

Please refer to FIG. 10 showing a cooler with ground heated plane according to another embodiment of the invention. This embodiment is substantially same as the first embodiment. The differences are that the bottom plane 311' of the thermally conductive seat 31' is only arranged an accommodating groove 310'; the cooler 30' has three heat pipes 32', each of which has a flat evaporation section 321' passing through a plurality of cooling fins 33'; the three heat pipes 32' arranged in parallel and pressed (clamped) in the accommodating groove 310' are flush with each other to form a flat evaporation section 321'; similarly, when the surface of the flat evaporation sections 321' is higher than the bottom plane 311' of the thermally conductive seat 31', the flat evaporation sections 321' are the heated plane 34'; on the other hand, when the surface of the flat evaporation sections 321' is flush with the bottom plane 311' of the thermally conductive seat 31', the heated plane 34' then includes the flat evaporation sections 321' and the bottom plane 311'.

Figure 11:
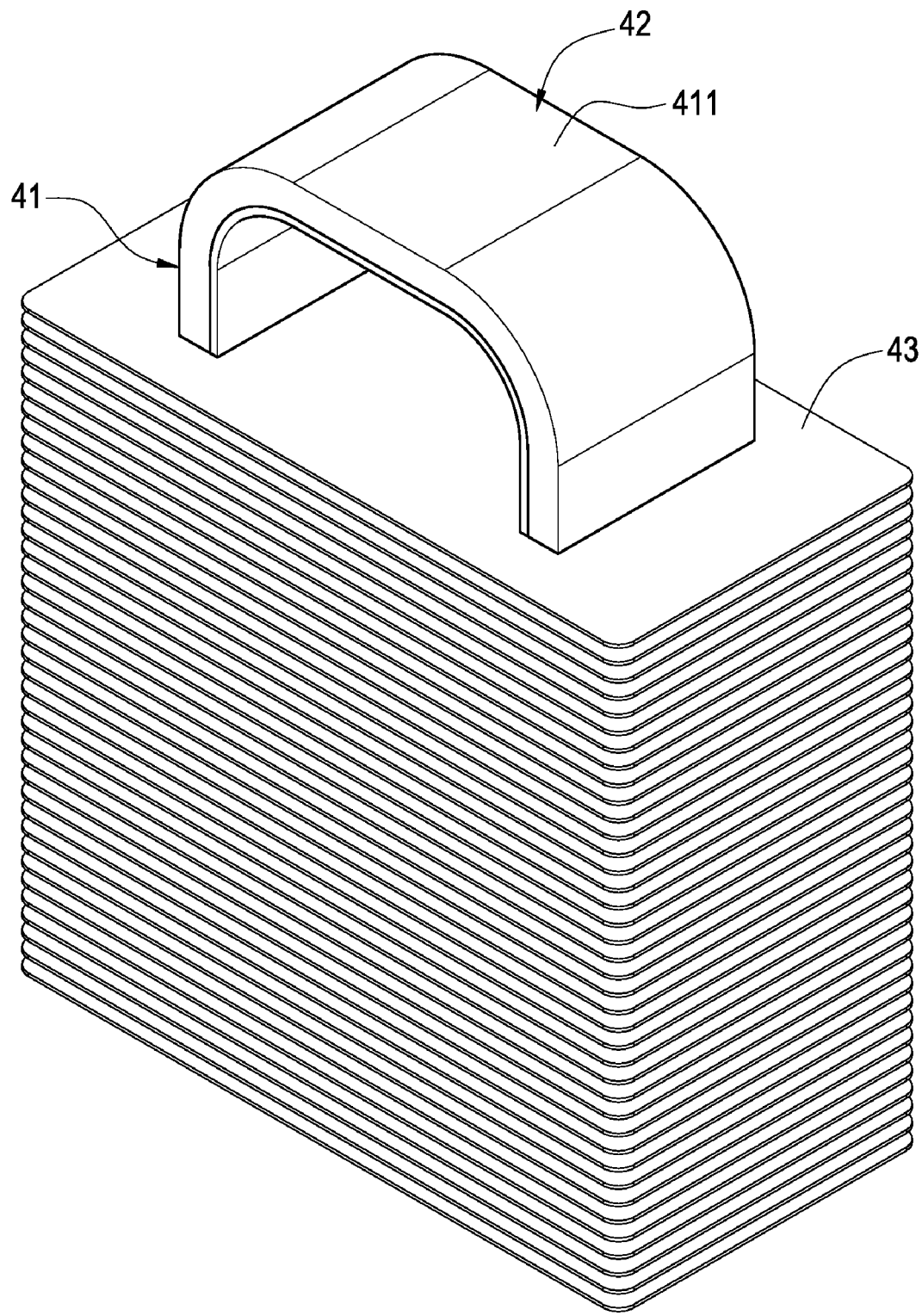
FIG. 11 shows a cooler with ground heated plane according to a further embodiment of the invention.

Please refer to FIG. 11 showing a cooler with ground heated plane according to a further embodiment of the invention. In this case, the cooler 40 is a flat-plate heat pipe 41 that has a flat evaporation section 411 and is arranged a plurality of cooling fins 43. The flat evaporation section 411 is the heated plane 42 that is ground to make its surface possess better surface roughness and flatness, thereby, the heated plane 42 contacting the heating electronic component further closely to increase its thermally conductive effect.

Accordingly, through the constitution of aforementioned assemblies, a cooler with ground heated plane according to the invention is thus obtained.

Summarizing aforementioned description, the ground heated plane according to the invention is an indispensably design for a cooler indeed, which may positively reach the expected usage objective for solving the drawbacks of the prior arts, and which extremely possesses the innovation and progressiveness to completely fulfill the applying merits of new type patent, according to which the invention is thereby applied. Please examine the application carefully and grant it as a formal patent for protecting the rights of the inventor.

However, the aforementioned description is only a number of preferable embodiments according to the present invention, not used to limit the patent scope of the invention, so equivalently structural variation made to the contents of the present invention, for example, description and drawings, is all covered by the claims claimed thereinafter.

What is claimed is:

1. A method for grinding heated plane of cooler, including:
   (a) providing a grinder having a grinding plate and a fixture, wherein the fixture corresponds to the grinding plate and has a disk configuration, a circumference of the fixture projects out a plurality of pressure plates, and a bottom portion of each pressure plate is arranged a pointed bulge;
   (b) providing a cooler having a heated plane, and arranging the cooler to each pressure plate of the fixture, wherein the cooler includes a thermally conductive seat, at least one heat pipe and a plurality of cooling fins, the thermally conductive seat is arranged at least one slot for insetting a flat evaporation section of the heat pipe, when a surface of the flat evaporation section is higher than a bottom plane of the thermally conductive seat, the flat evaporation section is the heated plane, and when the surface of the flat evaporation section is flush with the bottom plane of the thermally conductive seat, the heated plane then includes the flat evaporation section and the bottom plane, and a condensation section of the heat pipe passes through the cooling fins, so that when a top portion of the thermally conductive seat is pressed and clamped by the pointed bulge, the heated plane is abutted against the grinding plate and is arranged correspondingly, thereby, the fixture pressing and clamping the cooler via a point contact manner;
   (c) injecting an abrasive into a gap between the grinding plate and the heated plane;
   (d) making the fixture press and clamp the cooler, thereby, the heated plane being contacted closely with the abrasive;
   (e) rotating the grinding plate, and undergoing at least one grinding process to the heated plane; and
   (f) after the heated plane is ground, a delicate plane like mirror is obtained, which is provided for closely contacting a heating electronic component to dissipate heat thereof.

2. The method for grinding heated plane of cooler according to claim 1 wherein, in step (c), the abrasive includes a grinding liquid and grinding particles.

3. The method for grinding heated plane of cooler according to claim 1 wherein, in step (c), a series of grinding processes can be undergone and, in each grinding processes, different abrasives with different particle sizes can be injected.

4. The method for grinding heated plane of cooler according to claim 3, wherein the abrasive with larger particles can be first injected to undergo a first grinding and, after the first grinding is finished, another abrasive with finer particles can then be injected to undergo a second grinding.

\* \* \* \* \*